(12) United States Patent
Mitra

(10) Patent No.: US 6,280,248 B1
(45) Date of Patent: *Aug. 28, 2001

(54) HOLD-DOWN ELEMENT FOR ELECTRICAL AND/OR ELECTRONIC COMPONENTS

(75) Inventor: Niranjan K. Mitra, Eindhoven (NL)

(73) Assignee: Berg Technology, Inc., Reno, NV (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/987,364

(22) Filed: Dec. 9, 1997

Related U.S. Application Data

(63) Continuation-in-part of application No. 08/544,894, filed on Oct. 18, 1995, now abandoned, which is a continuation of application No. PCT/NL94/00075, filed on Apr. 12, 1994, now abandoned.

(30) Foreign Application Priority Data

Apr. 19, 1993 (NL) .................................................... 9300660

(51) Int. Cl.$^7$ .................................................... H01R 13/73
(52) U.S. Cl. .............................................................. 439/571
(58) Field of Search ............................ 439/567, 571–573, 439/82, 751, 873

(56) References Cited

U.S. PATENT DOCUMENTS

| 3,954,242 | 5/1976 | Yoda ..................................... 248/223 |
| 4,168,879 | 9/1979 | Ohtsuki et al. .................... 339/258 P |
| 4,332,431 | 6/1982 | Bobb et al. ......................... 339/74 R |
| 4,538,878 | 9/1985 | Dambach et al. ................. 339/217 R |
| 4,735,584 | 4/1988 | Seaquist et al. ...................... 439/361 |
| 4,735,587 | 4/1988 | Kirayoglu ............................ 439/751 |
| 4,836,806 | 6/1989 | Dougherty et al. ................. 439/751 |
| 4,897,053 | 1/1990 | Verhoeven et al. ................. 439/751 |
| 5,120,257 | 6/1992 | Hahn .................................... 439/567 |
| 5,145,405 | 9/1992 | Akiyama ............................. 439/525 |
| 5,145,407 | 9/1992 | Obata et al. ......................... 439/567 |
| 5,422,789 | 6/1995 | Fisher et al. ........................ 361/719 |

FOREIGN PATENT DOCUMENTS

| 0 068 656 | 6/1982 | (EP) ......................................... 13/41 |
| 0 366 964 | 10/1989 | (EP) ......................................... 23/70 |
| 0 497 554 A1 | 1/1992 | (EP) ......................................... 23/70 |
| 1001306 | 8/1965 | (GB) . |

*Primary Examiner*—Gary F. Paumen
(74) *Attorney, Agent, or Firm*—Brian J. Hamilla; M. Richard Page; Steven M. Reiss

(57) ABSTRACT

Hold-Down element (1) for holding, in a clamping manner, an electrical and/or electronic component, such as a connector, onto a substrate. The hold-down element (1) comprising a first part (2) for engaging the substrate and a second part (5) for engaging the component to be mounted. The first part (2) having an essentially flat, elongate shape provided with a member (7) which is offset with respect to the raised member (7), so that the first part (2), under the influence of a force exerted thereon during the insertion of the hold-down element (1) in a mounting opening, can diverge in the opposite direction to the raised member (7) and can engage, in a clamping manner, the substrate by means of the divergent portion in the mounting opening. The hold-down element (1) may also be used as the connecting end of a component.

15 Claims, 5 Drawing Sheets

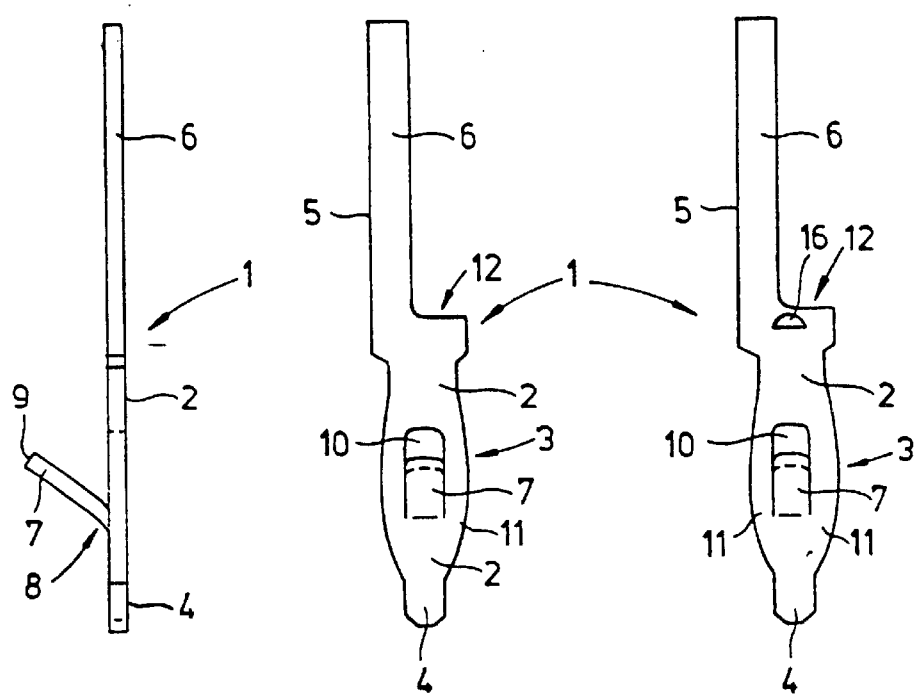
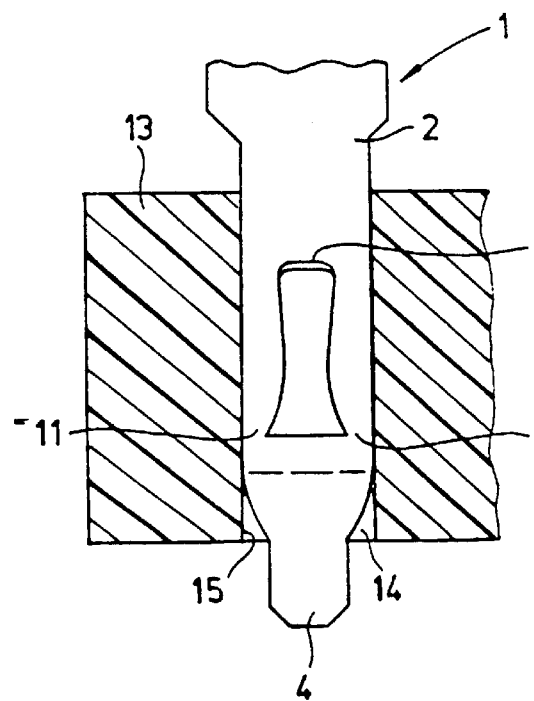
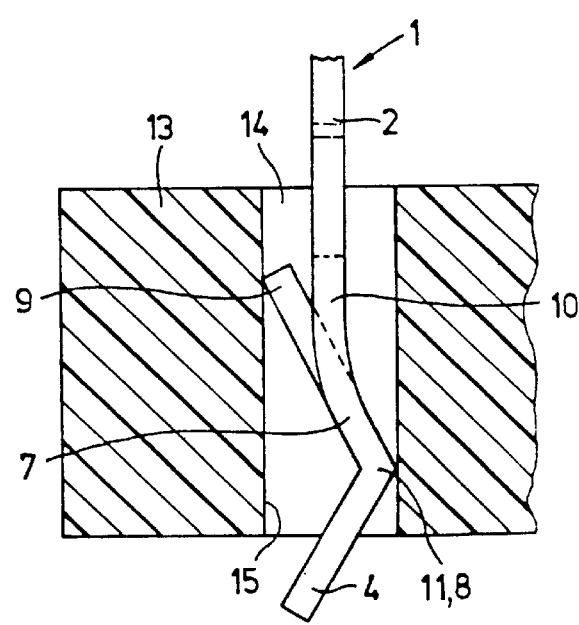

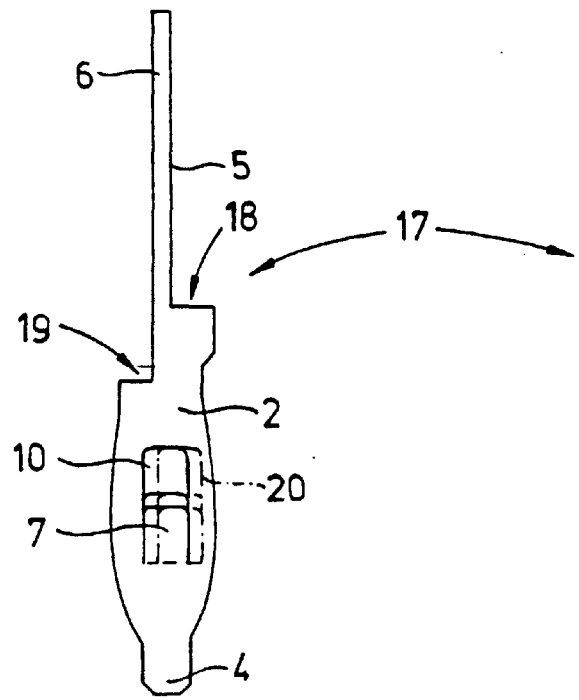
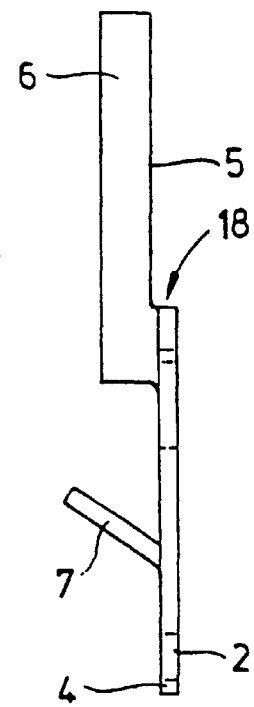
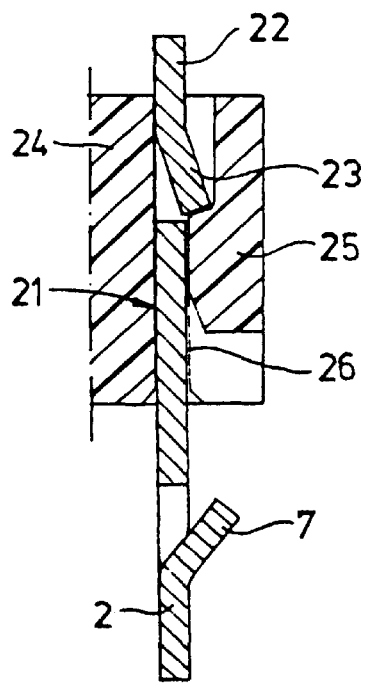
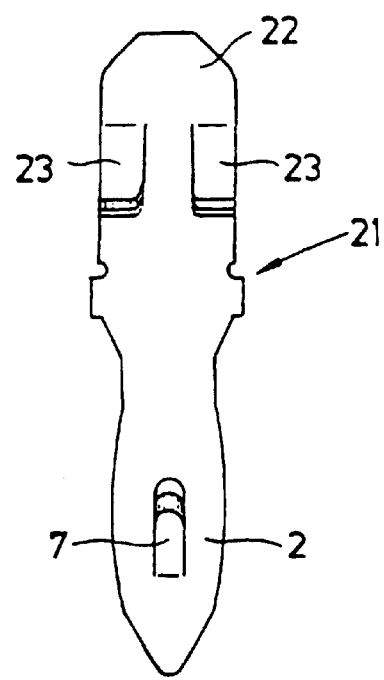

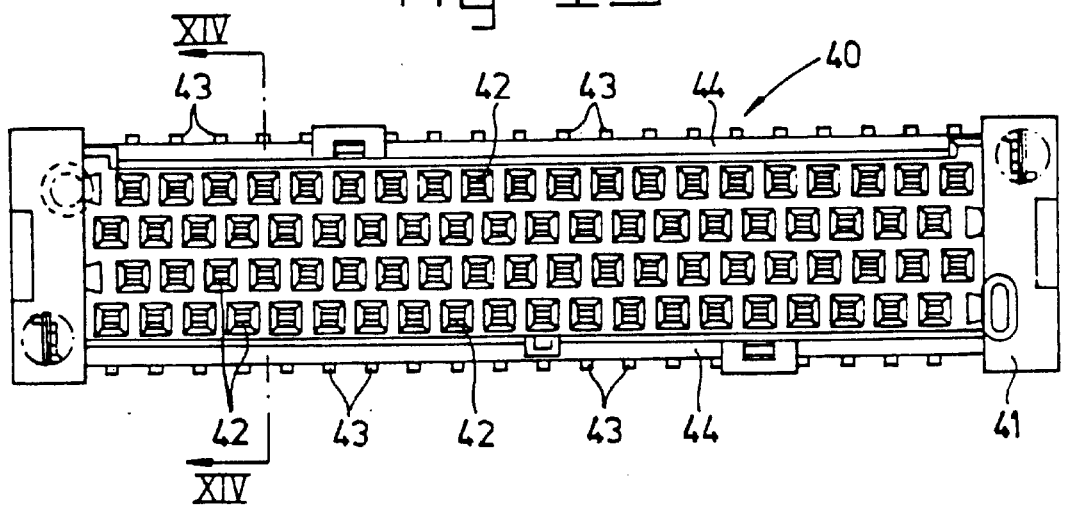
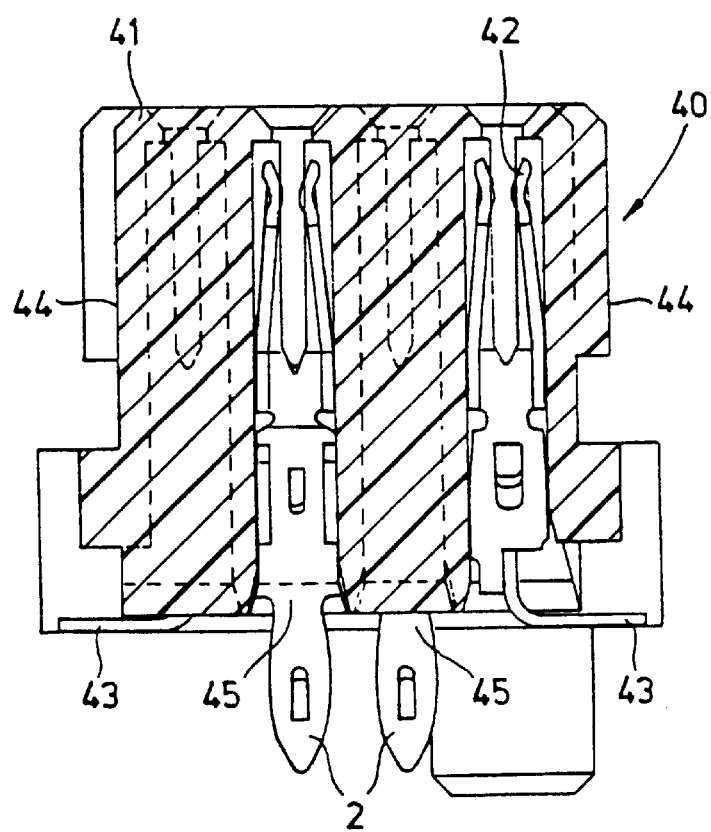
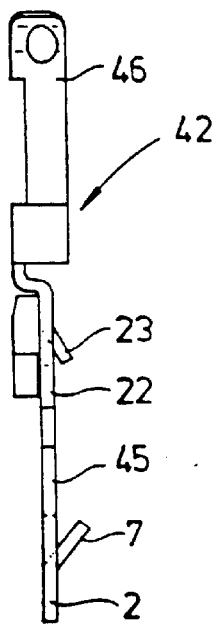

HOLD-DOWN ELEMENT FOR ELECTRICAL AND/OR ELECTRONIC COMPONENTS

CROSS REFERENCE TO RELATED APPLICATIONS

This is a continuation-in-part of U.S. patent application Ser. No. 08/544,894, filed Oct. 18, 1995, now abandoned, which is a continuation of PCT/NL94/00075 filed Apr. 12, 1994, abn.

BACKGROUND OF THE INVENTION

1. Field of the Invention

The invention relates to a hold-down element for holding an electrical and/or electronic component onto a substrate, particularly for mounting a connector onto a printed circuit board, comprising a first part for engaging the substrate and a second part for engaging the substrate and a second part for engaging the component to be mounted, which first part has an essentially flat, elongated shape provided with means for engaging in a clamping manner in a mounting opening of the substrate, said means comprise a member which is raised with respect to the plane of the first part.

2. Brief Description of Prior Developments

Many different embodiments of hold-down elements of this type are know from the prior art.

European Patent Applications 0,366,964 and 0,497,554 describe hold-down element of a first type in which the first part, to be received in a mounting opening, is provided with retention hooks or retention teeth, which, in the mounted state, provide the required force for securing the respective component to the substrate by biting into the wall of the mounting opening.

Hold-down elements of this type can be used only for mounting components on substrates having such a structure that the relevant retention hooks or retention teeth can bite into it. When mounting on glass substrates, such as, for example, the substrate of a liquid crystal display device, such hold-down element cannot generally be used. For this purpose, in practice, use is made of hold-down elements of a second type which engage in a clamping manner in a mounting opening of the substrate. A hold-down element of this type is, for example, described in U.S. Pat. Nos. 3,954,242 and 5,145,405.

The hold-down element know from U.S. Pat. No. 4,538,878 is rather a combination of said first and second type.

Hold-down elements provided with retention hooks or retention teeth must be constructed in a relatively robust manner so that they can withstand the relatively powerful force required for inserting them into a mounting opening. It should also be borne in mind that these hold-down elements have to have large dimensions such that they also provide a sufficient mounting force in mounting openings whose dimensions are subject to a relatively high tolerance, for example, of the order of magnitude of 5 to 10%. Clearly, the mounting force is highest in the case of mounting a hold-down element of relatively large size in a mounting opening which, as a result of tolerance, is relatively small.

Hold-down elements which are to be mounted in a clamping manner in a mounting opening are generally constructed so as to be relatively wide, in order to provide the required fastening power, such as, for example, the hold-down element disclosed in the above mentioned U.S. Pat. No. 5,145,407.

In view of present day attempts to achieve a reduction in the scale (miniaturization) of electronic components, which, for example, include attempts at achieving connectors having a pitch distance between the contact elements of, for example, 1 mm or 1.27 mm, with the relatively thin-walled housing associated therewith, hold-down elements provided with retention hooks or retention teeth are unsuitable owing to the risk of damage to the housing resulting from the relatively high mounting forces exerted hereon during mounting.

Owing to their size, wide hold-down elements are unsuitable for being received between contact elements placed close to one another, which is the case, for example, with connectors which have to be mounted adjacent to one another without position loss ("end-to-end stackable").

SUMMARY OF THE INVENTION

The invention is therefore based on the provision of a hold-down element which is particularly suitable for use with electrical or electronic components of reduced dimensions (miniaturized components).

To this end, the invention provides a hold-down element in which the said means, for engaging onto the substrate, the first part, to be received in a mounting opening, being constructed so as to be weakened in an area which is offset with respect to the raised member, so that the first part, under the influence of a force exerted thereon during the insertion of the hold-down element into a mounting opening, can diverge in the opposite direction to the raised member and can engage the substrate by means of the divergent portion in the mounting opening.

Owing to its essentially flat shape, the first part of the hold-down element according to the invention, to be inserted into a mounting opening, can extend, for example, between the contact element of a miniaturized connector without risk of undesired electrical connections between adjacent contact elements or the connection ends for the connection of an electrical circuit wiring thereof.

The first part having the raised member must have a size with respect to the mounting opening such that, when it is mounted, sufficient mechanical resistance is encountered, which imposes a mounting force such that the first part is brought to the location of the weakened area therein as far as the intended divergence. Owing to the lack of elements having to bite into the material of a substrate, a considerably smaller force is required for inserting the hold-down element according to the invention in a mounting opening and, as a consequence, there is a considerably lower degree of mechanical load on the housing of a component during mounting thereof than is the case with hold-down elements of the above mentioned first type.

The divergence of the hold-down element which is achieved by means of, according to the invention, selectively weakening the first part of the said hold-down element, to be received in the mounting opening, provides an additional fastening action supporting the raised member. The divergence of the first part holds the raised member rigidly against the wall of the mounting opening, as a result of which differences in tolerance in the mounting opening have a negligible effect on the mounting force to be achieved.

Because the first part of the hold-down element according to the invention makes contact via its divergent portion with the wall of the mounting opening after the first part has been inserted therein, in the case of through-metallized mounting openings a more reliable electrical contact is achieved between the hold-down element and the metal layer of the mounting opening than with the know hold-down elements.

In face, in the latter case, those parts of the hold-down element which provide the mounting force slide over the metal layer of the mounting opening during mounting. This results in a portion of the relatively thin metal layer being scraped off, which has an unfavorable effect on the electrical connection to be achieved between the hold-down element and the metal layer, for example, for the purposes of earthing. The hold-down element is consequently also very suitable as a connection end for an electrical connection of the relevant component with a circuit wiring. Electrical connections of this type are also referred to by the term "press-fit" in the English language specialist literature.

In contrast to a hold-down element which engages a substrate by biting into it, the additional clamping action provided by the divergent portion of the hold-down element according to the invention also means that changes occurring in the shape or dimensions of the mounting opening, for example, due to temperature variations, during the forecast service life, are accurately matched.

By causing the first part to diverge in the opposite direction to the raised member, a centering action of the hold-down element with respect to the mounting opening is also achieved, which is particularly advantageous in those applications where accurate positioning of the component with respect to the substrate is desired. The position of the weakened area with respect to the raised member determines the manner in which the first part diverges in the mounting opening. A weakening extending in the longitudinal direction of the first part will result, when mounting the hold-down element according to the invention in a cylindrical mounting opening, in a more or less partially cylindrical divergence of the first part. By suitably weakening the first part at various positions, the divergence can be affected in such a manner that a, for example, arbitrary contour of a mounting opening can be matched.

In the preferred embodiment of the hold-down element according to the invention, the first part is constructed so as to be weakened in an area which is offset in the longitudinal direction thereof with respect to the raised member, so that the first part is able to bend or fold under the influence of a force in the longitudinal direction.

By suitably choosing the dimensions of the first part, the raised member and the position and dimensions of the weakened area in the first part, a desired accurate centering of the hold-down element with respect to the mounting opening can be achieved. Because the raised member and the bent or folded portion engage the substrate at various levels, viewed in the longitudinal direction of the mounting opening, it is possible to bring about a stable attachment similar to a three-legged gripping.

It has been shown that, by shifting the fitting of the raised member with respect to the longitudinal center line of the first part, it is possible to achieve a spiral-type or helical-type gripping in the mounting opening. This is, for example, desirable if dirt present on the metallizing layer of a mounting opening has to be removed in order to achieve a desired electrical contact.

The weakening of the first part in accordance with the invention can be achieved by selectively varying the thickness thereof. A weakening which is relatively simple in terms of operating technique can be brought about by selectively making one or more recesses in the first part.

In the preferred embodiment of the hold-down element according to the invention, the raised member is lip-shaped and extends from the first part at an angle with respect to the plane thereof, with one end fixedly connected to the first part in a resilient manner and one raised free end, which free end can engage in a mounting opening on the fixed end of the lip-shaped member.

A hold-down element constructed in this manner is inserted via, first, the fixed end of the lip-shaped member, into the mounting opening. Because the lip-shaped member is constructed to be resilient, a relatively small force suffices to this purpose. As a result of the higher opening, in order to overcome the increasing frictional force, a point will be reached at which the first part diverges and the lip-shaped member is rigidly held against the wall of the mounting opening. If a force is now exerted on the hold-down element in the direction of removal from the mounting opening, the lip-shaped member tends to move in the direction which is transverse to the plans of the first part, which not only results in a more powerful engagement of the lip-shaped member on the wall of the mounting opening, but also gives rise to a greater divergence, or bending or folding, respectively, of the first part, which results in a further increase of the clamping force in the mounting opening. Clearly, a desired firm mounting force is achieved with this action.

In an embodiment which is advantageous from a production technique standpoint, the lip-shaped member is formed from the material of the first part such that a recess is made therein, the first part being constructed so as to be narrower in the width direction near the fixed end of the lip-shaped member. By further giving the contour of the first part a suitable shape, sure control may be afforded at that point where this diverges, during insertion thereof into a mounting opening.

In the preferred embodiment of the hold-down element according to the invention, the first part is provided with an approximately partially elliptical contour, with a centering lip for centered insertion of the first part in a mounting opening. The centering lip ensures correct positioning of the first part with respect to the mounting opening while the elliptical contour ensures that the point at which the first part diverges is reached if this is received over a distance in the mounting opening.

In a further embodiment of the hold-down element according to the invention, a step is formed near the transition between the first and the second part, for engaging onto a component to be mounted. In order to achieve a step or shoulder of sufficient size in hold-down elements of relatively small dimensions, for use with miniaturized components, the second part is constructed to be pin-shaped and is connected to the first part with its longitudinal center line offset with respect to the longitudinal center line of the first part.

A further enlargement in the plane of the step is achieved in a yet further embodiment of the invention by providing the second part with a flat elongated form and positioning the planes of the first and second part transversely to each other. If desired, offset steps may be formed in the longitudinal direction of the first part, on either side of the longitudinal center line, in order to establish as symmetrical as possible an exertion of force on the first part during insertion thereof in a mounting opening.

In order to hold the hold-down element firmly in a housing of a component, the first and/or second part may, for example, be turned through 90° after being inserted in an opening in the housing, or the first part may be provided with further means for fastening in the housing of a component. In this case, consideration may be given, interalia, to a resilient lip-shaped member or, for example, a (semi-) bowl-shaped bulge or the like, formed from the material of the second part. Other suitable fastening means are known per se from the prior art.

The hold-down element according to the invention may, as a whole, be formed by punching or another suitable mechanical process from a blank of metal, such as brass, stainless steel, phosphorus, bronze, beryllium, copper, and the like. The hold-down element may be coated with a layer of tin, lead, nickel, gold, silver or another suitable alloy of electrically conducting material, in the event that the hold-down element is to be connected, for the purposes of earthing or as a contact or, respectively, connection end, in an electrically conducting manner to a through-metallized mounting opening, if appropriate by means of an additional soldering process. If desired, the first part of the hold-down element may be provided with a plurality of raised members and a plurality of weakened areas interacting therewith, for example for use with substrates having specially shaped mounting openings.

The invention also relates to an electrically insulating material provided with one or more contact elements made from an electrically conducting material, one or more hold-down elements being received in the housing via their second part, in accordance with one or more of the embodiments described above. The hold-down elements may be arranged both at the ends of a housing and between or adjacent to the contact elements in the housing.

In a yet further embodiment, the invention provides a connector in which one or more contact elements are provided with a connection end formed in accordance with the first part of the hold-down element according to the invention. In a preferred embodiment of the electrical connector, in which the contact elements are arranged in rows in the housing, one or more of the row or rows of contact elements located adjacent to a side wall of the housing are equipped, for surface mounting attachment, with connection ends extending outwards past the relevant side wall, and the remaining row or rows of contact elements are provided with connection ends in accordance with the first part of the hold-down element according to the invention.

With a connector constructed in this manner, the problem of connection ends, for surface mounting techniques, lying close to one another and extending sideways outside the housing, and the accompanying increased risk of undesired mutual electrical connections, which plays an important role particularly in the case of connectors having a relatively small pitch distance, is effectively eliminated. Indeed, in the case of a connector consisting of, for example, four rows of contact elements, the innermost two rows may be provided with a press-fit connection end as mentioned above, and the outermost rows may be equipped with connection ends according to the surface mounting technique. Only these connection ends then have to project sideways from the housing of the connector, with the result that the risk of undesired mutual electrical connections is considerably smaller than in the case of a connector all of whose connection ends project sideways. In the embodiment according to the invention, furthermore, contact ends are permissible having a larger surface area than in the case of a corresponding connector according to the prior art, which may be of importance in connection with requirements relating to the permissible current density in the contact elements, in particular in the case of so-called power connectors.

Theoretically, it is also possible to manufacture the connection ends of the contact elements of the innermost rows for surface mounting attachment, and then to allow these to project inside the periphery of the housing or to construct these connection ends as conventional pin/hole connections. In the English language specialist literature, this is also known as the "through-mount" technique. However, this has the disadvantage that visual checking of the solder connections made is impossible or insufficient, while soldering of pin/hole connections also requires a wave solder bath, which is impossible in combination with connections according to the surface mounting technique. This problem does not arise in the case of the press-fit connections according to the invention. Because only a limited number of rows of the connector are provided with press-fit connection ends, a relatively large surface area of, for example, a printed circuit board remains for two-sided assembly thereof by means of the surface mounting technique.

BRIEF DESCRIPTION OF THE DRAWINGS

The invention is not restricted to application to connectors and/or connectors with reduced dimensions (miniaturization) and is illustrated in greater detail in the following with reference to the preferred embodiments shown in the drawing.

FIG. 1 shows a diagrammatic view of a preferred embodiment of the hold-down element according to the invention;

FIG. 2 shows a diagrammatic side view of the hold-down element according to FIG. 1;

FIG. 3 shows, on an enlarged scale, a diagrammatic sectional view of a portion of the hold-down element according to FIG. 1, in the mounted state;

FIG. 4 shows a diagrammatic side view of the mounted hold-down element according to FIG. 3;

FIG. 5 shows a diagrammatic view of a further embodiment of the hold-down element according to FIG. 1;

FIG. 6 shows a diagrammatic view of yet a further embodiment of the hold-down element according to the invention;

FIG. 7 shows a diagrammatic side view of the hold-down element according to FIG. 6;

FIG. 8 shows a diagrammatic view of yet a further embodiment of the hold-down element according to the invention;

FIG. 9 shows a diagrammatic sectional view of the hold-down element according to FIG. 8, in the mounted state in a housing of an electrical or electronic component;

FIG. 13 shows a diagrammatic top view of an embodiment of a connector provided with contact elements having connection ends in accordance with the first part of the hold-down element according to the invention;

FIG. 14 shows, on an enlarged scale, a diagrammatic sectional view along the line XIV—XIV in FIG. 13;

FIG. 15 shows a diagrammatic view of a contact element provided with a connection end according to the first part of the hold-down element according to the invention.

DETAILED DESCRIPTION OF THE PREFERRED EMBODIMENTS

Figure 10:
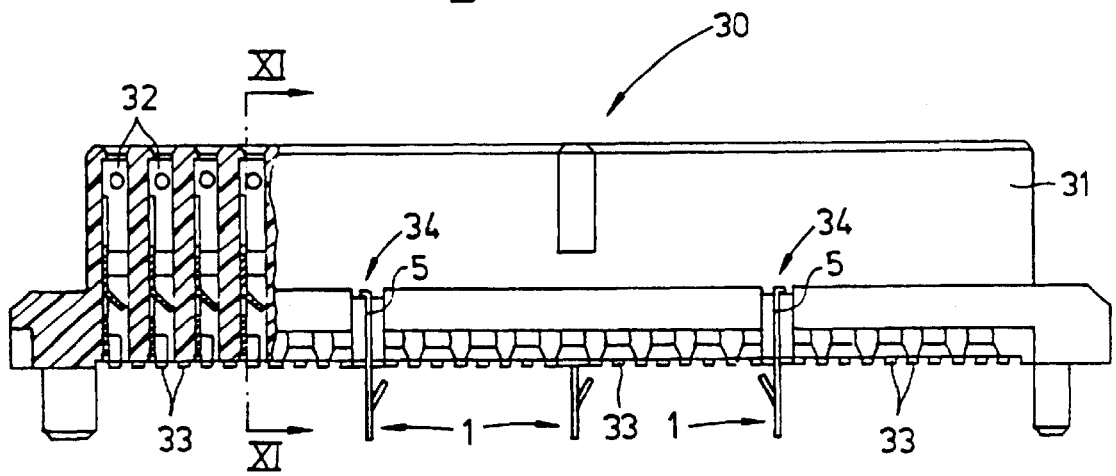
FIG. 10 shows a diagrammatic sectional view of an electrical connector provided with hold-down elements according to the invention.

In the preferred embodiment of the invention, shown in FIG. 1, the hold-down element according to the invention is indicated overall by the reference numeral 1. The first part or substrate part 2 to be inserted into a mounting opening has the shape of a plane elongate board, with an approximately elliptical contour 3. On an end of the first part 2, the elliptical contour 3 continues into a centering lip 4 and, on another end, into a second part or component part 5 for gripping on a component to be mounted. In the embodiment shown, the second part 5 has the shape of an elongate flat pin 6.

A lip-shaped member 7 projects from the first part 2 at an angle with respect to the plane thereof, see FIG. 2. This lip-shaped member 7 is formed from the material of the first part 2 and is firmly connected to the first part 2 in a resilient manner via an end 8 adjacent to the centering lip 4. The free end 9 of the lip-shaped member 7 is raised with respect to the plane of the first part 2 and is adjacent to the transition of the first part 2 and second part 5 of the hold-down element 1.

The rectangular recess 10 arising from the manufacture of the lip-shaped member 7 in the first part 2 is positioned with respect to the elliptical contour 3 of the first part such that the active flat surface area of the first part 2 adjacent to the fixed end 8 of the lip-shaped member 7 is narrowed in the width direction. In this manner, a weakened area 11 is formed in the first part 2. This weakened area 11 forms a bend or fold line for bending or folding the first part 2 under the influence of a force in the longitudinal direction thereof. Area 11 is weakened because the opposed lateral sides of the recess 10 diverge outwardly at the lower end of the recess as is particularly shown in FIG. 3.

In the embodiment of the hold-down element 1 shown, the second part 5 is connected to the first part 2 with its longitudinal center line offset or shifted with respect to the longitudinal center line of the first part 2. In this manner, a step or shoulder 12 is formed for gripping on a component to be mounted. Preferably, the hold-down element 1 as a hole is formed by punching, or the like, from a blank of metal. The action of the hold-down element 1 is illustrated in greater detail with reference to FIGS. 3 and 4.

When mounting the hold-down element 1, the centering lip 4 ensures that the first part 2 is positioned correctly with respect to a mounting opening 14 in a substrate 13. The lip-shaped member 7 is inserted in the mounting opening 14 via, first, its fixed end 8. Because the lip-shaped member 7 is connected to the first part 2 in a resilient manner, the latter will have a relatively small influence on the required mounting force during mounting of the hold-down element 1.

The first part 2 and the circular-cylindrical mounting opening 14 of the substrate 13 are accurately dimensioned within wide limits. The partially elliptical contour 3 of the first part 2 means that the frictional force between the substrate 13 and the first part 2 during mounting thereof gradually increases so that an increasing mounting force is necessary in order to insert the first part 2 further into the mounting opening 14. When the mounting force is greater than the force which the weakened area 11 can withstand, the first part 2, as envisaged, will diverge with respect to the plane thereof. Also, under the influence of the transverse force exerted by the raised member 7 on the first part 2, the latter will diverge in a direction which is opposite to the direction of the raised member 7.

FIG. 4 clearly shows that, in the mounted state of the hold-down element 1, the first part 2 grips onto the wall 15 of the mounting opening 14 both with its divergent or weakened area 11 and with the free end 9 of the lip-shaped member 7. Because, in this case, the first part 2 also undergoes a certain curving in the width direction, as illustrated in FIG. 3 with the deformation of the recess 10, a three legged, or, respectively, three-point, desired, stable, centered gripping is produced on the wall 15 of the mounting opening 14.

On exerting a force on the first part 2 in the direction of the second part 5 thereof, in order to remove the first part 2 from the mounting opening 14, the free end 9 of the lip-shaped member 7 will more firmly engage the wall 15 of the mounting opening 14, with the result that the lip-shaped member 7 is forced in the direction which is transverse to the plane of the first part 2. However, a force is simultaneously exerted in the opposite direction by the divergent portion 11, which results in a still more powerful gripping onto the substrate 13, or, respectively, the wall 15, of the mounting opening 14.

However, removal of the first part 2 from the mounting opening 14 is easily possible if the lip-shaped member 7 is pushed away from the wall 15 by means of an accessory, such as a pin (not shown), inserted from the centering lip 4 in the mounting opening 14. This is unlike hold-down elements equipped with teeth or the like, which bite into the material of the substrate.

Clearly, the first part 2 may be weakened in various ways, for example by providing a plurality of slots, incisions and the like in both the transverse and longitudinal direction of the hold-down element. As a result of this, a divergence may be established which matches the shape of a mounting opening. Also, a plurality of lip-shaped members or other suitable members, for the purpose of a clamping fitting in a mounting opening, may project from the surface of the first part 2. For example, bowl-shaped bulges.

The gripping of the weakened area 11 onto the wall 15 of the mounting opening 14 is produced only at the moment when the first part 2 has more or less arrived at its final position in the mounting opening. In the case of a through-metallized mounting opening 14, that is to say a mounting opening 14 whose wall 15 is provided with an electrically conducting layer, the portion 11 in this case grips onto a still undamaged portion of the metal layer. Unlike, for example, hold-down elements provided with teeth which bite into the substrate, the hold-down element according to the invention also gives rise to a considerably better and more reliable electrical connection, for example, for the purposes of earthing or screening or contact.

By means of the additional force effect with which the divergent portion 11 presses the lip-shaped member 7 against the wall 15 of the mounting opening 14, a holding action is achieved which during the anticipated service life, can effectively take up variations in the dimensions of the interacting parts, occurring as a result of temperature influences and aging.

In order to keep the second part 5 of the hold-down element 1 in engagement with a component, it can, for example, be embedded firmly in the material of the housing of the component. Also, latch means, which are know per se, for receiving the second part 5 in a clamping manner in the housing may be provided. In order to support gripping onto a component, the hold-down element 1 is, in a further embodiment, as shown in FIG. 5, provided with a semi-bowl-shaped bulge 16 on the transition area between the first part 2 and the second part 5.

An effective gripping onto the housing of a component is achieved by constructing the second part 5 flat and in a pin shape. After inserting the second part 5 in a, for example, slot-shaped opening of a housing, this part 5 can, for example, be turned at its end through a quarter turn, whereby a strong gripping onto the housing is achieved. In this way, the step 12 rests against the housing in order to exert a mounting force on the first part 2 for its insertion in a mounting opening.

The active surface area of the step 12, with which the latter lies against a housing, may be increased by positioning the flat, pin-shaped second part 5 with its plane transverse to the plane of the first part 2, as shown in FIG. 6. In this embodiment, two steps 18, 19 are formed which are offset in the longitudinal direction of the hold-down element 17. FIG. 7 shows a side view of the hold-down element 17, clearly illustrating the mutual positioning of the planes of the first and second part 2, 5.

When a sure cleaning action on a metallizing layer in the mounting opening 14 has to be carried out in order to remove soiling or corrosion layers, it can be advantageous to position the lip-shaped member 7 so it is shifted, that is to say asymmetric, with respect to the longitudinal center line of the first part 2. This is as shown diagrammatically in FIG. 6 by means of the broken lines 20. During insertion of such a hold-down element in the mounting opening 14, the first part 2 will undergo a certain rotation, similar to a screw thread attachment. This rotation will brush away soiling from the surface of the metallizing layer and give rise to a desired electrical contact, with the advantages as mentioned above.

FIG. 8 shows a yet further embodiment of a hold-down element 21 according to the invention, with a second part 22 provided with two lips 23 which, in the mounted state, are able to engage the housing of an electrical or electronic component. The first part 2 of the hold-down element 21 is constructed in accordance with the embodiments mentioned above.

FIG. 9 shows a side sectional view of the hold-down element 21 according to FIG. 8, in which the lips 23 grip behind a ridge 25 formed in a housing 24 of a component. The second part 22 is received, in this case, in a narrow, rectangular opening 26 of the housing.

FIG. 10 shows an embodiment of a connector 30 provided with hold-down elements 1 according to FIG. 5, for mounting on a substrate. The connector comprises a housing 31 made, for example, from plastic, in which contact elements 32 made from an electrically conducting material are provided. In the embodiment shown, the contact elements 32 are provided with contact ends 33 for surface-mounting attachment on a substrate. The hold-down elements 1 project alternately on either side of the housing 31 between the contact ends 33. For fastening the flat, pin-shaped second part 5 of the hold-down element 1 in the housing, it is received in a rectangular opening in the housing and bent at right angles at its free end 34.

Figure 11:
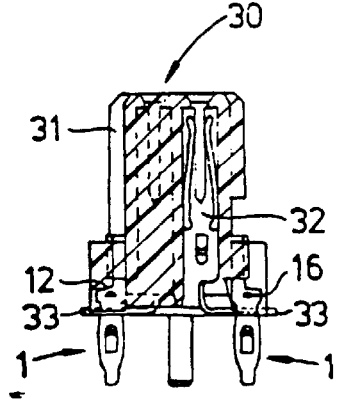
FIG. 11 shows a diagrammatic sectional view along the line XI—XI in FIG. 10.

FIG. 11 shows a sectional view along the line XI—XI in FIG. 10. Gripping of the hold-down element with its step 12 and bulge 16 can readily be discerned.

Figure 12:
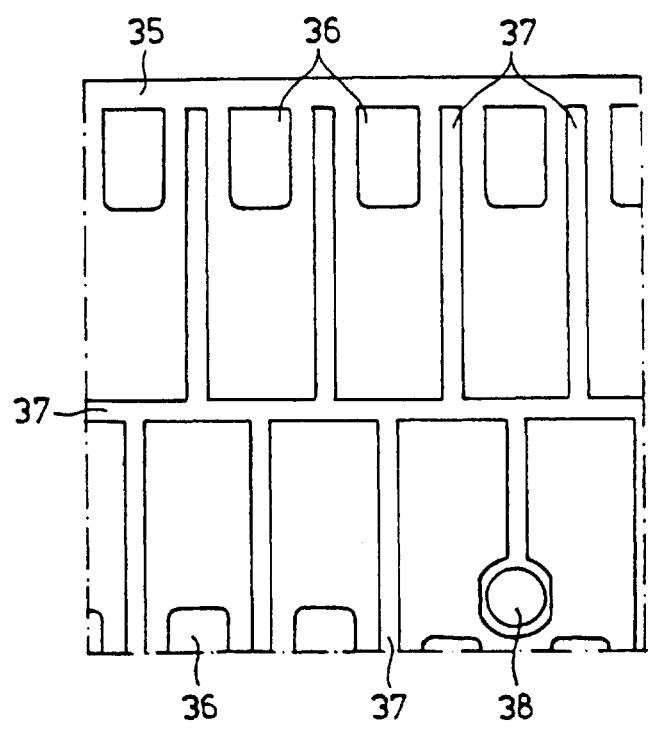
FIG. 12 shows, on an enlarged scale, a view of a portion of a substrate provided with mounting openings for mounting hold-down elements according to the invention therein.

FIG. 12 shows a view of a portion of a printed circuit board 35 for mounting the connector 30. Small connection planes 36 made from electrically conducting material are arranged on the board 35 for connecting the connection ends 33 of the contact elements 32. Tracks 37 made from electrically conducting material project between the small connection planes 36 and connect to through-metallized mounting openings 38 for receiving the hold-down elements in an electrically conducting manner, for the purpose of screening and earthing. If desired, the hold-down elements may be soldered in the relevant mounting opening or be attached by means of electrically conducting glue. By way of example, the figure shown only one mounting opening 38.

FIG. 13 shows the top view of an embodiment of a further connector 40, having an elongate housing 41 in which four rows of contact elements 42 are accommodated. The outermost two rows of contact elements 42 are provided with connection ends 43 for surface-mounting attachment, which ends project outwards transversely to the long side walls 44 of the housing 41. The contact elements 42 of the innermost two rows are provided with connection ends 45 which are formed in accordance with the first part 2 of the hold-down element 1, 21 described above. This may be seen clearly in FIG. 14 which is a sectional view along the line XIV—XIV in FIG. 13.

Because the connection ends of the contact elements 42 of the innermost two rows of the connector 40 do not have to be constructed sideways past the side walls 44, the connection ends 43 may, if desired, be constructed so as to be relatively wide, while preserving a sufficient mutual distance in order to avoid undesirable mutual connections. This is especially important in the case of automatic assembly of printed circuit boards having components of miniaturized dimensions, thus, for example, connectors 40 having a pitch distance of 1 mm or 1.27 mm.

FIG. 15 shows a contact element 42, fitted in the connector according to FIG. 13, with a connection end 45 in accordance with the first part of the hold-down element according to the invention, and a first part of the hold-down element according to the invention, and a contact end in the form of a socket 46. Of course, the contact end may also be constructed as a plug.

Figure 16:
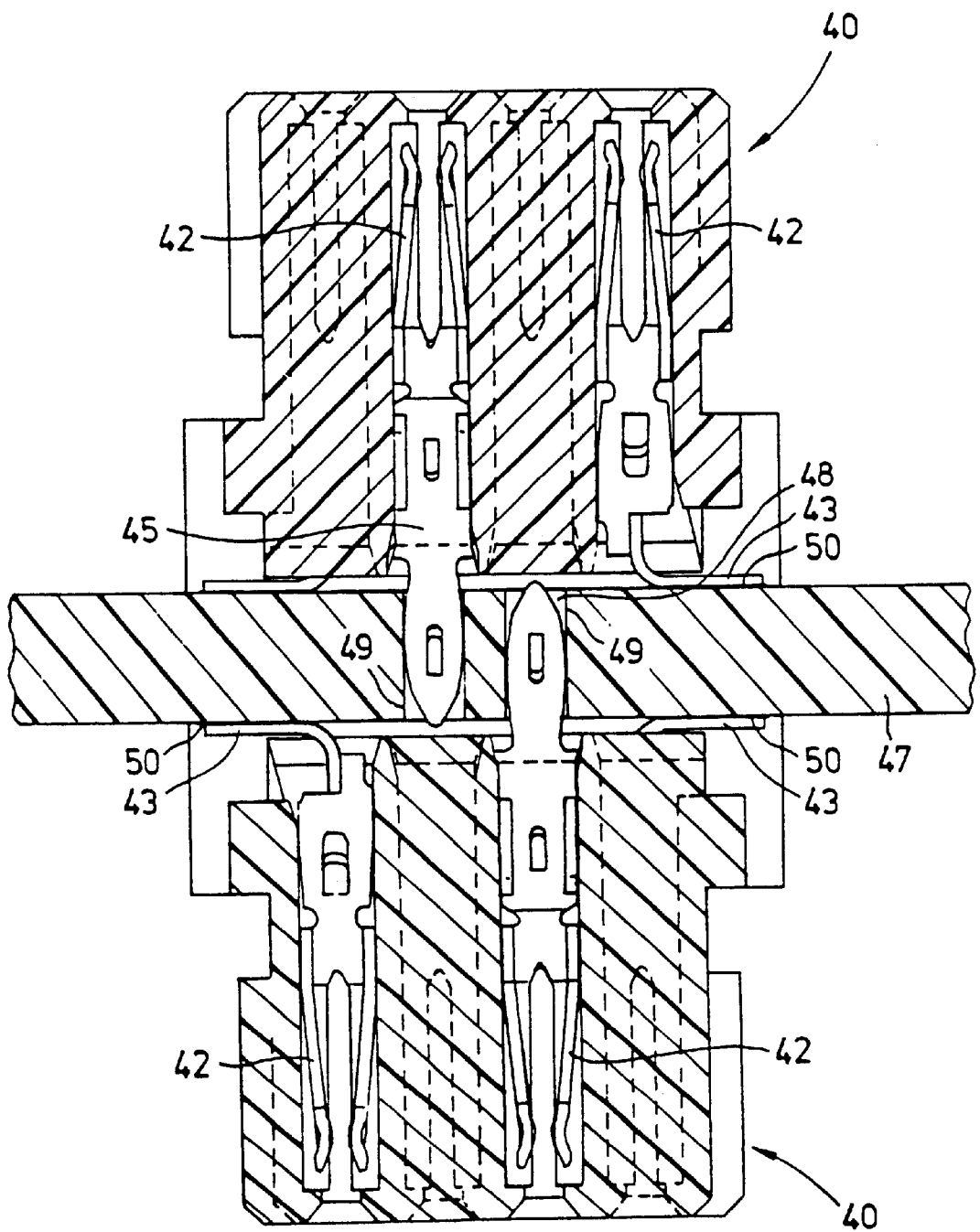
FIG. 16 shows a diagrammatic sectional view of two connectors, according to FIG. 13, mounted opposite each other on a substrate.

FIG. 16 shows, finally, two connectors 40 positioned opposite each other and mounted on a printed circuit board 47. The contact ends 45 of the contact elements 42 grip, in this case, onto through metallized walls 49 of mounting openings 48 in the board 47, while the contact ends 43 of the outermost rows of contact elements 42 grip onto small contact planes 50 on the respective surfaces of the printed circuit board 47.

This sectional view clearly shows that, by means of suitable positioning of the innermost rows of contact elements 42, only a small flat surface is lost for surface-mounting techniques, in the present case the flat surface lying under the two connectors 40 which, in practice, will be virtually no disadvantage.

Naturally, the invention is not restricted to the embodiments shown and to application in a connector. The hold-down element may essentially be used for mounting a random component on a substrate, particularly if a small mounting force is required, as with components having miniaturized dimensions. If the connection ends of a component, for example, the connection ends of the contact elements of a connector are designed for pin/hole solder mounting, each contact end may be provided with a first part according to the hold-down element of the invention.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A hold-down element for holding an electrical and/or electronic component onto a substrate, particularly for mounting a connector onto a printed circuit board, comprising a first part for engaging the substrate and a second part for engaging the component to be mounted, which first part has an essentially flat, elongate shape provided with a member which is raised with respect to the plane of the first part for engaging a mounting opening of the substrate, characterized in that the first part is constructed so as to have at least one recess which produces a weakened area with respect to the raised member, so that the first part, under the influence of a force exerted thereon during the insertion of the hold-down element in a mounting opening, can diverge out of the plane thereof and in the opposite direction to the raised member, can engage the substrate with the divergent portion in the mounting opening and the raised member is lip-shaped and extends from the first part at an angle with respect to the plane thereof, with one end fixedly connected to the first part in a resilient manner and one raised free end, which free end can engage in a mounting opening on the substrate, the first part being provided with said at least one recess near the fixed end of the lip-shaped member and the lip-shaped member is formed from the material of the first part such that aid at least one recess is made therein, the first part being constructed so as to be narrower in the width direction near the fixed end of the lip-shaped member, such that said hold-down has a relatively low insertion force and a relatively high retention force.

2. A hold-down element according to claim 1, wherein the first part is constructed so as to be weakened in an area which is offset in the longitudinal direction thereof with respect to the raised member, so that the first part is able to bend or fold under the influence of a force in the longitudinal direction.

3. A hold-down element according to claim 1, wherein the raised member is shifted with respect to the longitudinal center line of the first part.

4. A hold-down element according to claim 1 wherein the first part is provided with an approximately partially elliptical contour, with a centering lip for centered insertion of the first part in a mounting opening.

5. A hold-down element according to claim 1 wherein a step is formed near the transition between the first and the second part, for gripping onto a component to be fastened.

6. A hold-down element according to claim 5 wherein the second part is constructed to be pin-shaped and the step is formed as a result of the second part being connected to the first part with its longitudinal center line offset with respect to the longitudinal center line of the first part.

7. A hold-down element according to claim 1 wherein the second part is provided with a latch member for holding a hold-down element in a housing of a component.

8. A hold-down element according to claim 7 wherein said latch member comprises at least one lip or bulge which projects with respect to the plane of the second part.

9. A hold-down element according to claim 1 produced as a whole from a metal blank.

10. A hold-down for securing an electrical component to an opening in a circuit substrate, comprising:
    a retention section securable to the electrical component; and
    a mounting section extending from the electrical component for securing to the circuit substrate, said mounting section having:
        a planar region having a width larger than the opening and including a weakened area; and
        a lip projecting from said plane of said planar region to a first side to engage the circuit substrate;
    wherein, as said planar region engages the opening, said weakened area causes said planar region to buckle from said plane of said planar region to a second side of said planar region opposite said first side.

11. The hold-down as recited in claim 10, wherein said planar region has an opening therein, said opening defining said lip and said weakened area.

12. The hold-down as recited in claim 10, wherein said weakened area is a reduced width section.

13. The hold-down as recited in claim 10, wherein said retention section includes a projection to engage the electrical component.

14. The hold-down as recited in claim 10, wherein said retention section includes at least one lip to engage the electrical component.

15. A hold-down for securing an electrical component to an opening in a circuit substrate, comprising:
    a retention section securable to the electrical component; and
    a mounting section extending from the electrical component for securing to the circuit substrate, said mounting section having:
        a planar region defined by a perimeter, said planar region having a width larger than the opening and including an aperture within said perimeter, wherein said aperture forms a plurality of weakened areas;
        a lip adjacent said aperture and projecting from said plane of said planar region to a first side to engage the circuit substrate;
    wherein as said planar region engages the opening, said weakened areas buckle from said plane of said planar region to a second side of said planar region opposite said first side.

* * * * *